(12) United States Patent
Gopalan et al.

(10) Patent No.: US 8,941,089 B2
(45) Date of Patent: Jan. 27, 2015

(54) RESISTIVE SWITCHING DEVICES AND METHODS OF FORMATION THEREOF

(71) Applicant: Adesto Technologies Corporation, Sunnyvale, CA (US)

(72) Inventors: Chakravarthy Gopalan, Santa Clara, CA (US); Jeffrey Shields, Sunnyvale, CA (US); Venkatesh Gopinath, Fremont, CA (US); Janet Siao-Yian Wang, Los Altos, CA (US); Kuei-Chang Tsai, Cupertino, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/767,800

(22) Filed: Feb. 14, 2013

(65) Prior Publication Data

US 2013/0214234 A1     Aug. 22, 2013

Related U.S. Application Data

(60) Provisional application No. 61/601,942, filed on Feb. 22, 2012.

(51) Int. Cl.
*H01L 29/04* (2006.01)
*H01L 45/00* (2006.01)
(Continued)

(52) U.S. Cl.
CPC ............... *H01L 45/08* (2013.01); *H01L 45/16* (2013.01); *H01L 21/06* (2013.01); *H01L 21/04* (2013.01); *H01L 45/065* (2013.01); *H01L 45/085* (2013.01); *H01L 45/1233* (2013.01); *H01L 45/1253* (2013.01); *H01L 45/142* (2013.01); *H01L 45/143* (2013.01); *H01L 45/144* (2013.01); *H01L 45/146* (2013.01); *H01L 45/147* (2013.01)
USPC .................. 257/3; 257/E45.002; 257/E45.003

(58) Field of Classification Search
CPC . H01L 45/085; H01L 45/1233; H01L 45/124; H01L 45/1253; H01L 45/142–45/144; H01L 45/146; H01L 45/08; H01L 45/16; H01L 45/04; H01L 45/06; H01L 45/065
USPC .................. 257/3–5, E45.002, E45.003, 774, 257/E23.175, E21.584; 438/627, 103, 104
See application file for complete search history.

(56) References Cited

U.S. PATENT DOCUMENTS 5,892,285 A * 4/1999 Gonzalez et al. ............. 257/763
6,107,687 A * 8/2000 Fukada et al. ................ 257/762
(Continued)

OTHER PUBLICATIONS

Arantani, K., et al., "A Novel Resistance Memory with High Scalability and Nanosecond Switching," Electron Devices Meeting 2007, Washington, D.C., Dec. 2007, IEEE International, pp. 783-786.
(Continued)

*Primary Examiner* — William Kraig
*Assistant Examiner* — Joseph C Nicely
(74) *Attorney, Agent, or Firm* — Slater & Matsil, L.L.P.

(57) ABSTRACT

In accordance with an embodiment of the present invention, a resistive switching device includes an opening disposed within a first dielectric layer, a conductive barrier layer disposed on sidewalls of the opening, a fill material including an inert material filling the opening. A solid electrolyte layer is disposed over the opening. The solid electrolyte contacts the fill material but not the conductive barrier layer. A top electrode is disposed over the solid electrolyte.

15 Claims, 16 Drawing Sheets

(51) Int. Cl.
*H01L 21/06* (2006.01)
*H01L 21/04* (2006.01)

(56) References Cited

U.S. PATENT DOCUMENTS

| | | | |
|---|---|---|---|
| 6,847,047 B2 | 1/2005 | VanBuskirk et al. | |
| 7,035,141 B1 | 4/2006 | Tripsas et al. | |
| 7,348,672 B2 * | 3/2008 | Chen et al. | 257/758 |
| 7,579,631 B2 | 8/2009 | Gaun et al. | |
| 7,981,773 B2 | 7/2011 | Krieger et al. | |
| 8,203,863 B2 | 6/2012 | Kim et al. | |
| 8,618,526 B2 * | 12/2013 | Sorada et al. | 257/4 |
| 2006/0060832 A1 | 3/2006 | Symanczyk et al. | |
| 2006/0199377 A1 | 9/2006 | Ufert | |
| 2007/0194301 A1 * | 8/2007 | Sezi et al. | 257/40 |
| 2007/0281456 A1 * | 12/2007 | Kim et al. | 438/592 |
| 2008/0232160 A1 | 9/2008 | Gopalakrishnan | |
| 2008/0253168 A1 | 10/2008 | Blanchard et al. | |
| 2008/0265369 A1 * | 10/2008 | Liaw | 257/532 |
| 2008/0274585 A1 * | 11/2008 | Lung et al. | 438/102 |
| 2009/0140232 A1 | 6/2009 | Ufert | |
| 2009/0155541 A1 * | 6/2009 | Anderson et al. | 428/173 |
| 2009/0197404 A1 * | 8/2009 | Yang | 438/652 |
| 2010/0012914 A1 | 1/2010 | Xu et al. | |
| 2010/0127233 A1 | 5/2010 | Goux et al. | |
| 2011/0037096 A1 * | 2/2011 | Dunn et al. | 257/140 |
| 2011/0217836 A1 * | 9/2011 | Chen et al. | 438/600 |
| 2011/0303887 A1 * | 12/2011 | Otsuka | 257/1 |
| 2011/0317470 A1 | 12/2011 | Lu et al. | |
| 2012/0104569 A1 * | 5/2012 | Chen | 257/659 |
| 2013/0062587 A1 * | 3/2013 | Lee et al. | 257/4 |
| 2013/0178058 A1 * | 7/2013 | Edelstein et al. | 438/643 |
| 2014/0024196 A1 * | 1/2014 | Ootsuka | 438/382 |

OTHER PUBLICATIONS

Chen, A., "Status and Challenges in Ionic Memories," Strategic Technology Group, AMD, Nov. 12, 2008, 34 pages.
Hisashi, S., et al., "Basics of RRAM based on transition metal oxides," International Symposium on Advanced Gate Stack Technoloy, Sep. 29-Oct. 1, 2010, 25 pages.
Jo, S.H., "Nanoscale Memristive Devices for Memory and Logic Applications," Dissertation submitted in partial fulfillment of the requirements for the degree of Doctor of Philosphy, University of Michigan, 2010, 153 pages.
Kozicki, M.N., et al., "Non-Volatile Memory Based on Solid Electrolytes," Axon Technologies Coporation, Tempe, Arizona, 2004, pp. 1-8.
Valov, I., et al., "Electrochemical Metallization memories-fundamentals, applications, prospects," Nanotechnology, 2011, 23 pages.
Waser, "Resistive Non-Volatile Memory Devices (Invited Papers)," ScienceDirect, Microelectronic Engineering 86, Mar. 2009, Elsevier B.V., pp. 1925-1928.
Wong, "Emerging Memories," Department of Electrical Engineering, Stanford University, Presentation, Apr. 2008, 77 pages.
Wong, et al., "Phase Change Memory," Proceedings of the IEEE, vol. 98, No. 12, Dec. 2010, IEEE, pp. 2201-2227.

* cited by examiner

RESISTIVE SWITCHING DEVICES AND METHODS OF FORMATION THEREOF

This application claims the benefit of U.S. Provisional Application No. 61/601,942, filed on Feb. 22, 2012, entitled "Semiconductor Devices and Methods of Formation Thereof," which application is hereby incorporated herein by reference.

TECHNICAL FIELD

The present invention relates generally to electronic devices, and more particularly to resistive switching devices and methods of formation thereof.

BACKGROUND

The semiconductor industry demands that every new technology has to deliver increasing performance and density but with lower cost. Flash memory is the mainstream non-volatile memory in today's market. However, Flash memory has a number of limitations that is posing a significant threat to continued advancement of memory technology. Current stand alone and embedded memory technologies suffer many drawbacks due to the extreme demands of scaling dictated by Moore's law.

Aggressive scaling has put the industry in such a predicament that only new materials, devices and newer system architecture will be able to provide the low energy, high speed, performance and high reliability requirements for the future. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), resistive RAM (RRAM), ionic memories including programmable metallization cell (PMC) or conductive bridging random access memory (CBRAM). These memories are also called as emerging memories.

One technology that holds promise to deliver such performance is Conductive Bridging Random Access Memory (CBRAM). Conventional non-volatile memories (NVM) technologies for both discrete and embedded applications require operational conditions that are incompatible with modern low voltage logic CMOS designs. These requirements create complex integration issues as well as costly process and array concept especially for embedded NVM use models. In contrast, CBRAM technology offers simple integration and scalable operational conditions. CBRAM may be integrated into copper and aluminum back end logic CMOS processes with minimal number of added masks with no adverse impact to the CMOS technology. CBRAM offers promising operation parametrics which are increasingly difficult to achieve with other types of memories such as low operational voltage (<1 V), low operational current (1 A), and ultrafast switching (<100 ns). These unique features make CBRAM technology an ideal candidate for embedded applications.

CBRAM technology is also known by other names such as programmable metallization cell (PMC) solid electrolyte memory, nano-ionic resistive memory, electrochemical memory (ECM). CBRAM memory devices utilize solid state electrochemistry to modulate the resistance of certain materials known as solid electrolytes by reversibly creating a nanoscale conductive link inside them when biased by small voltages.

As an example, devices using this technology may be composed of a thin film of silver doped chalcogenide or oxide glass sandwiched between a silver anode and an inert cathode. Under the influence of an electric field the electron current from the cathode reduces an equivalent number of Ag-ions as injected from the anode and a metal-rich electrodeposit is thereby formed in the electrolyte. The magnitude and duration of the ion current determines the amount of Ag deposited and hence the conductivity of the pathway. The electrodeposit is electrically neutral and stable; however, the formation process can be reversed by applying a bias with opposite polarity. The reverse ion current flows until the previously injected Ag has been oxidized ($Ag \rightarrow Ag^+ + e$) and deposited back to the electrode which supplied the metal. Thus, the resistivity increases again until the high value of the solid electrolyte is reached. This resistive switching of the material caused by the formation and removal of the metallic Ag pathway can be used for information storage. The basic storage element consists of an access transistor and a programmable resistor (1T-1R) (similar to the DRAM one transistor and one capacitor cell).

SUMMARY OF THE INVENTION

In accordance with an embodiment of the present invention, a resistive switching device comprises an opening disposed within a first dielectric layer, a conductive barrier layer disposed on sidewalls of the opening, a fill material comprising an inert material filling the opening. A solid electrolyte layer is disposed over the opening. The solid electrolyte contacts the fill material but not the conductive barrier layer. A top electrode is disposed over the solid electrolyte.

In accordance with an embodiment of the present invention, a method of forming a resistive switching device comprises forming an opening within a first dielectric layer over a substrate, forming a conductive barrier layer on sidewalls of the opening, and filling the opening with a fill material comprising an inert material. A solid electrolyte layer is formed over the opening. The solid electrolyte contacts the fill material but not the conductive barrier layer. A top electrode is formed over the solid electrolyte.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes

FIG. 3, which includes

FIG. 6, which includes FIGS. 6A-6D, illustrates a resistive switching device during various states of fabrication, wherein the top surfaces are selectively modified, wherein FIGS. 6C and 6D illustrate alternative embodiments;

FIG. 7, which includes

FIG. 8, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely ionic switching devices such as programmable metallization cells (also called as conductive bridging memories, nanobridge memories, or electrolytic memories). The invention may also be applied, however, to other types of memories, particularly, to any two terminal resistive memory such as metal oxide memories and phase change memories. Although described herein for a memory device, the embodiments of the invention may also be applied to other types of devices formed by resistive switching such as processors, dynamically-reroutable electronics, optical switches, field-programmable gate arrays, and microfluidic valves as well as other nanoionic devices.

Figure 1:
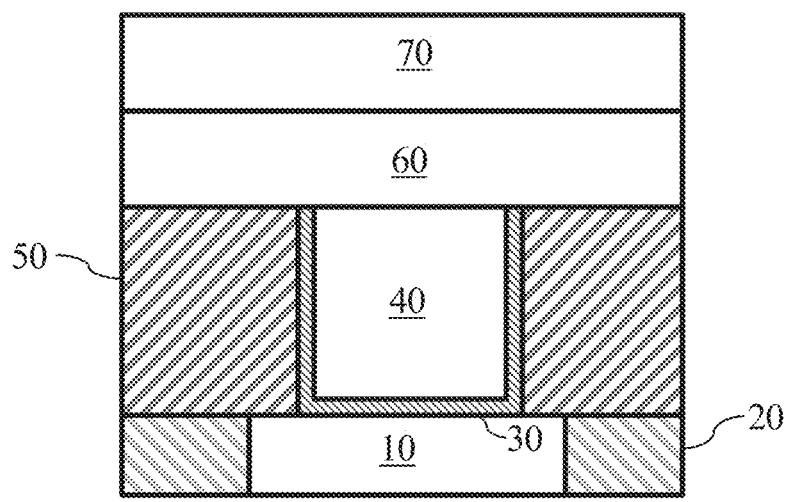
FIG. 1 illustrates a cross-sectional view of a prior art conductive bridging random access memory device.

FIG. 1 illustrates a cross-sectional view of a prior art CBRAM device.

Referring to FIG. 1, a metal line 10 is disposed within a first dielectric layer 20. The CBRAM device comprises a bottom electrode, which is an inert electrode, a solid electrolyte 60, a top electrode 70. The inert electrode of the CBRAM device is embedded within a second dielectric layer 50. The inert electrode is typically enclosed with a diffusion barrier/adhesion promoting layer. Accordingly, the inert electrode of the CBRAM device comprises a fill material 40 and a barrier layer 30. The solid electrolyte 60 and the top electrode 70 may be formed over the solid electrolyte 60.

In conventional resistive switching devices, two types of inert material surfaces contact the solid electrolyte: a top surface of the barrier layer and a top surface of the fill material. The inventors have identified that this has many disadvantages due to the difference in work functions, surface energies etc., which can result in uneven trigger voltage across the solid electrolyte. For example, the device may have a partial or soft trigger above a region of the switching layer 60 above the barrier layer 30 relative to the fill material 40.

A structural embodiment of a resistive switching device will be described using FIG. 2 (e.g., FIG. 2D). Further structural embodiments will be described using FIGS. 3-5, 7D, 8H, and 9. Embodiments of fabricating the resistive switching devices will be described using FIGS. 2, 5-9.

FIG. 2, which includes FIGS. 2A-2D, illustrates a resistive switching device during various stages of fabrication in accordance with an embodiment of the invention.

In various embodiments, resistive switching devices may be fabricated within metallization levels after forming the semiconductor regions within a substrate. In various embodiments, resistive switching devices may be integrated with back-end-of-the-line processes. As an example, the illustrated resistive switching device is formed over the first and the second metal levels. In various integration schemes, the location of the resistive switching device within the metallization layers may be different. The lower metal levels are disposed within a dielectric layer, which may comprise a plurality of dielectric layers. FIG. 2 illustrates an example of having at least three metallization levels under the resistive switching devices.

As will be described, in various embodiments, the resistive switching devices are disposed over a substrate 100. The substrate 100 may comprise a bulk silicon wafer in one embodiment. In other embodiments, the substrate 100 may comprise any suitable semiconductor, for example, within which the access device such as a transistor or diode is fabricated. Some examples of the substrate 100 include bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide or others can be used with the wafer. The substrate 100 may include wafers with epitaxial layers, for example, silicon epitaxial layer over a silicon bulk wafer, gallium nitride over silicon or gallium arsenide, and other hetero-epitaxial structures.

The substrate 100 may undergo front end processing using conventional semiconductor processing. For example, active device regions may be formed within the substrate 100 in various embodiments. The formation of active device regions may include forming transistor regions such as gate dielectric layers, gate electrode, source/drain regions, channel regions, and other associated structures such as isolation trench regions. For example, doped regions 110 may be formed within the substrate 100. The doped regions 110 may be source/drain regions of the transistors and may be formed using implantation and/or epitaxial process with further annealing. In one embodiment, a suitable silicide metal is deposited over the doped regions 110. The substrate 100 is then heated to about 500° C. to 700° C. The exposed doped regions 110 react with the silicide metal to form a layer of metal silicide. Any un-reacted silicide metal may be removed.

Next, the device undergoes back end of the line manufacturing, wherein, contacts are made to the semiconductor body and interconnected using metal lines and vias. Modern integrated circuits incorporate many layers of vertically stacked metal lines and vias (multilevel metallization) that interconnect the various components in the chip.

Figure 2A:
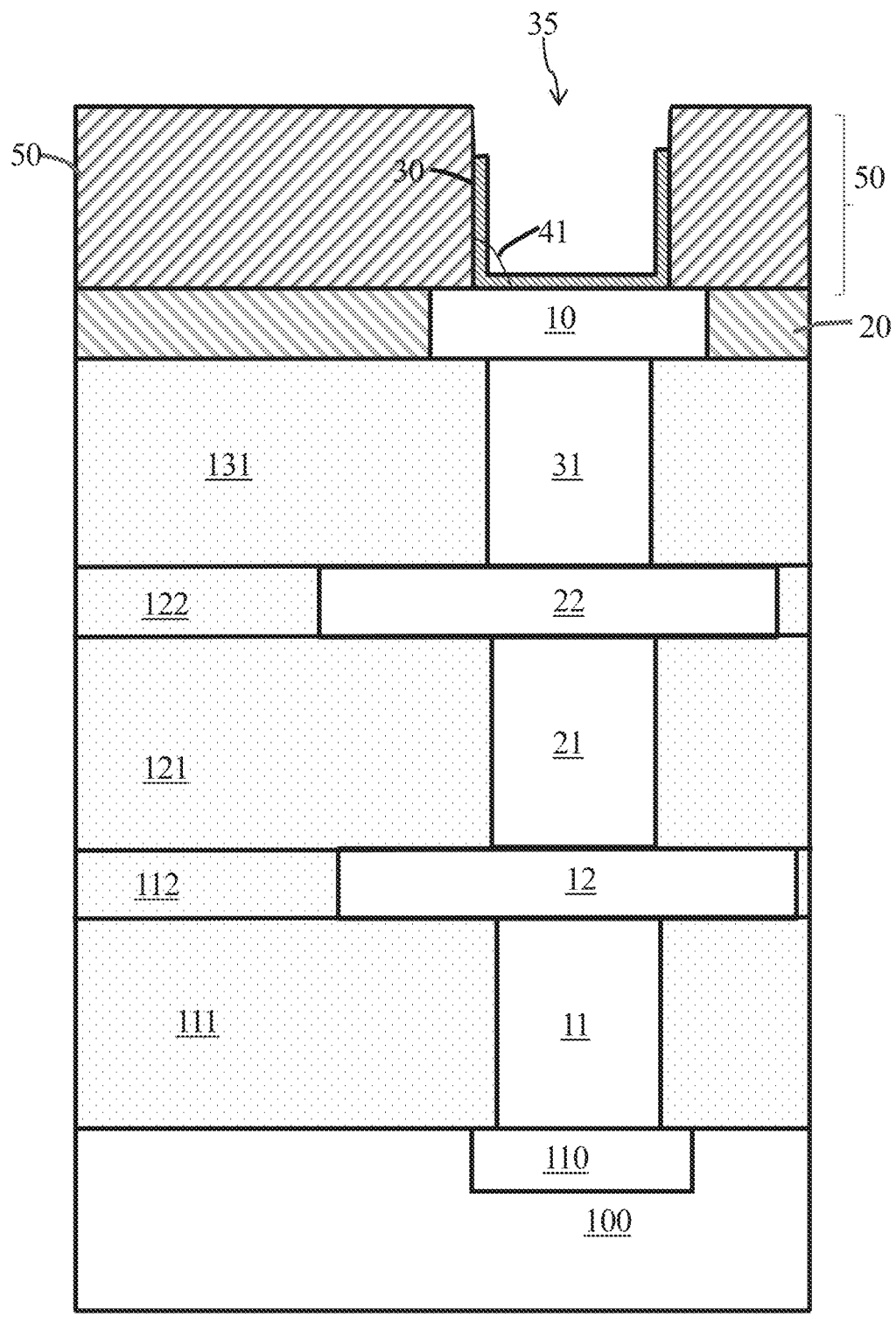
FIGS. 2A-2D, illustrates a resistive switching device during various stages of fabrication in accordance with an embodiment of the invention.

Referring to FIG. 2A, a plurality of metallization layers are formed over the substrate 100 using conventional processing. The metallization layers may be formed using damascene, dual damascene processes in various embodiments.

A first insulating layer 111 is formed above the substrate 100. The first insulating layer 111 may be an oxide layer in one or more embodiments. In one or more embodiments, the first insulating layer 111 may comprise an insulating layer suitable for inter level dielectric such as a deposited oxide. The first insulating layer 111 may comprise a plurality of layers in one or more embodiments. The first insulating layer 111 comprises insulating materials used in semiconductor manufacturing for inter-level dielectric (ILD) layers, such as $SiO_2$, tetra ethyl oxysilane (TEOS), which is a form of silicon dioxide, fluorinated TEOS (FTEOS), doped glass (BPSG, PSG, BSG), organo silicate glass (OSG), fluorinated silicate glass (FSG), spin-on glass (SOG), SiN, and/or SiON. The first insulating layer 111 may comprise a thickness of about 500 nm or less, for example. The first insulating layer 111 may include a number of insulating layers to facilitate the formation of the different metal lines and vias.

An etch stop liner (not shown) may be deposited prior to the first insulating layer 111 over the substrate 100. For example, a nitride film (e.g., silicon nitride) may be deposited as an etch stop liner.

Contact plugs 11 (first vias) are disposed within the first insulating layer 111 and may be coupled to various regions of the substrate 100. In one or more embodiments, the contact plugs 11 within the first insulating layer 111 may be coupled to doped regions 110 of an access device. In one embodiment, the doped regions 110 of the access device comprise source/drain regions. The contact plugs 11 may be coupled to the doped regions 110 through silicide regions in various embodiments.

In regions where the contact plugs 11 are to be made, contact holes are formed in the first insulating layer 111. In one process, photoresist (not shown) is deposited and patterned to mask off the non-exposed regions to the subsequent etch process. The first insulating layer 111 is then etched down to expose the underlying doped regions 110 using standard etch techniques such as a reactive ion etch. An optional conductive liner and a conductive material are then deposited using, for example, a chemical vapor deposition process (CVD), physical vapor deposition (PVD), or atomic layer deposition (ALD) process into the contact hole. Excess portions of the first insulating layer 111 are removed from the top surface of the first insulating layer 111, e.g., using a chemical-mechanical polishing (CMP) process forming the contact plugs 11 (first vias). In one or more embodiments, the contact plugs 11 may comprise tungsten and/or other contact materials such as copper, aluminum, Al—Cu—Si, other metals and combinations thereof. If the conductive material comprises tungsten, a bi-layer seed layer comprising CVD titanium nitride and silicon doped tungsten may be used in some embodiments. In some embodiments, the contact plugs 11 may be filled with copper.

A second insulating layer 112 is deposited over the first insulating layer 111. The second insulating layer 112 may comprise a similar material as the first insulating layer 111 in one embodiment. Another photoresist is deposited, patterned, and openings for the metal lines are formed. The first metal lines 12 may be formed within the openings for the metal lines, using, e.g., a single damascene process in one embodiment.

The first metal lines 12 in the second insulating layer 112 may be coupled to the contact plugs 11. The first metal lines 12 may comprise copper in one or more embodiments. In some embodiments, the first metal lines 12 may comprise other conductive materials such as aluminum. In one or more embodiments, the first metal lines 12 may include a diffusion barrier and other conductive liners.

A third insulating layer 121 is deposited over the first insulating layer 111. The third insulating layer 121 is disposed above the first and the second insulating layers 111 and 112. The third insulating layer 121 may comprise a similar material as the first third insulating layer 111. Alternatively, the third insulating layer 121 may comprise a low-k dielectric material. Second vias 21 are formed within the third insulating layer 121.

A fourth insulating layer 122 may be formed over the third insulating layer 121. Second metal lines 22 may be formed within the fourth insulating layer 122. A fifth insulating layer 131 is formed over the fourth insulating layer 122. The fifth insulating layer 131 includes third vias 31 disposed within.

Next, the elements of the resistive switching device are formed in accordance with embodiments of the present invention. In one embodiment, the resistive switching device is formed above the fifth insulating layer 131 as further described below.

A first dielectric layer 20 is deposited over the fifth insulating layer 131. A (third) metal line 10 is formed within the first dielectric layer 20. A second dielectric layer 50 is deposited over the first dielectric layer 20. In various embodiments, a bottom electrode of the resistive switching device is formed within the second dielectric layer 50, which may comprise silicon nitride, silicon oxide, TEOS, and others. The second dielectric layer 50 may comprise a similar material as the first insulating layer 111 in various embodiments. The second dielectric layer 50 may be about 10 nm to about 1000 nm, and about 30 nm to about 50 nm in one case. In one or more embodiments, the second dielectric layer 50 may be deposited using a chemical vapor deposition process or a plasma enhanced chemical vapor deposition process. The second dielectric layer 50 may be deposited using a plasma vapor deposition (PVD), although in different embodiments, other deposition techniques may be used.

A photo resist layer is deposited over the second dielectric layer 50. The photo resist layer is exposed for openings 35 using a lithographic process. The openings 35 expose a top surface of the metal line 10. A barrier layer 30 is deposited on the exposed sidewalls and bottom surface of the openings 35. In some embodiments, a polish stop layer may be deposited prior to the deposition of the barrier layer 30. The polish stop layer may be used to stop the subsequent chemical-mechanical polishing process.

The barrier layer 30 may be deposited using a CVD, PVD, ALD processes or electro-less plating. In various embodiments, the barrier layer 30 may have a thickness of about 5 nm to about 50 nm. In various embodiments, the barrier layer 30 having a thickness of about 5 nm to about 15 nm is deposited.

In various embodiments, the barrier layer 30 is not formed around an upper portion of the sidewalls of the opening 35. This is accomplished by not forming the barrier layer 30 over a top rim or upper portion of the opening 35. In various embodiments, such a structure may be produced in different ways. For example, a conformal barrier liner may be deposited and an upper portion of the conformal barrier liner may be subsequently removed. Alternatively, in another embodiment, the barrier material may not be deposited along the upper sidewall of the opening. In various embodiments, the sidewall angle 41 may be vertical or inclined to enable the formation of such a structure.

Advantageously, the absence of a small portion of the barrier layer 30 from the rim of the opening 35 has no negative impact on the beneficial effects of the barrier layer 30. For example, the barrier layer 30 may be designed to prevent in-diffusion of metal atoms from the underlying metal line 10. Further, the barrier layer 30 may be configured to promote adhesion with the second dielectric layer 50.

In various embodiments, the barrier layer 30 may comprise platinum, ruthenium, titanium nitride, tantalum nitride, tungsten nitride, titanium tungsten (TiW), molybdenum, gold, nickel, cobalt, iridium, and combinations thereof, and such other suitable materials used as a barrier material in the semiconductor industry. In one embodiment, the barrier layer 30 comprises tantalum nitride to prevent copper diffusion from the underlying metal line 10. In an alternative embodiment, the barrier layer 30 comprises titanium nitride. In various embodiments, the barrier layer 30 may comprise an electrochemically inert material (e.g., materials that do not react/diffuse with the switching layer to be deposited subsequently).

Figure 2B:
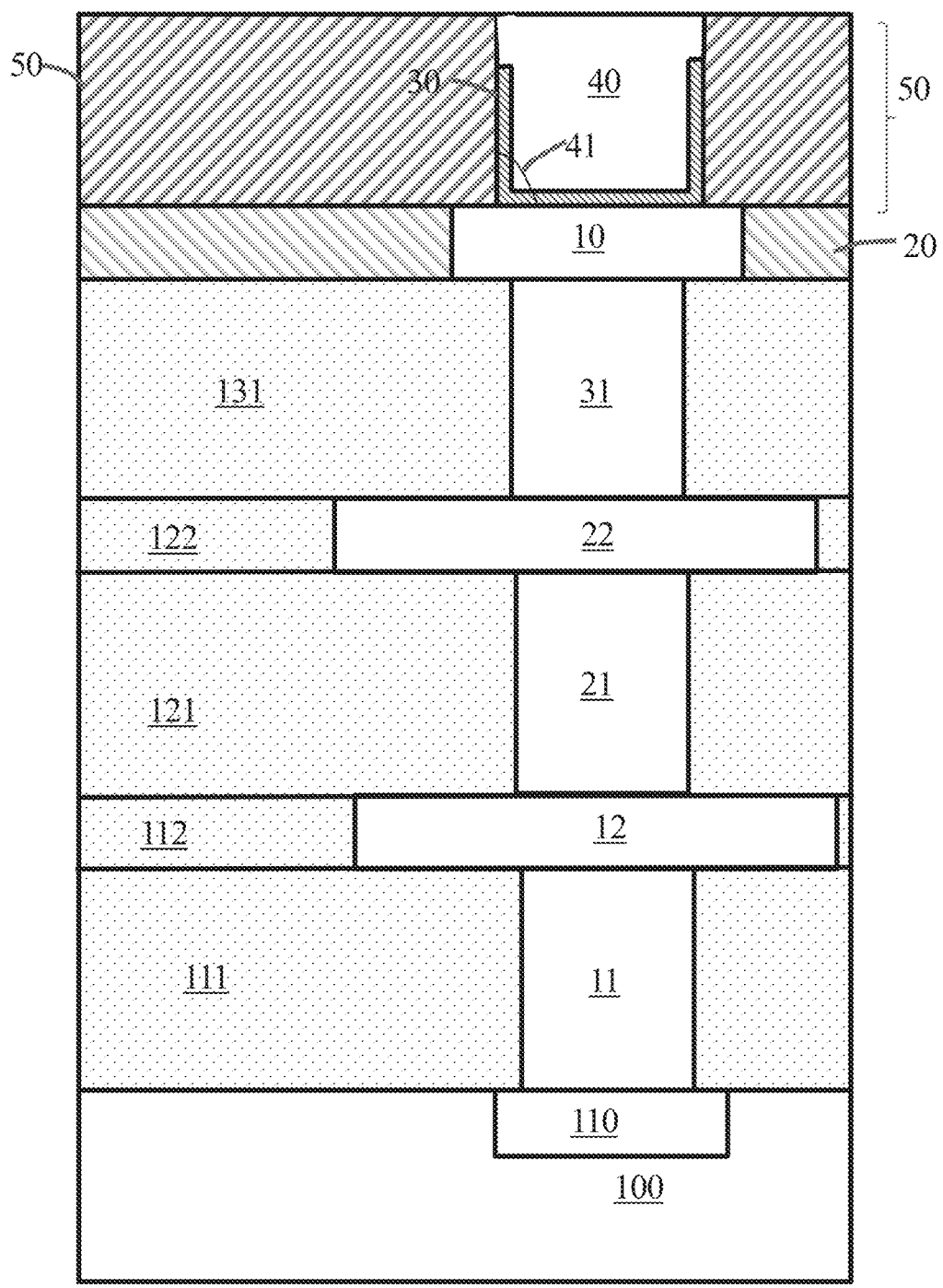

Referring next to FIG. 2B, the opening 35 may be filled with a fill material 40. The bottom electrode of a resistive switching may be an electrochemically inert material in one or more embodiments. Therefore, in one embodiment, tungsten (W) may be chosen for this layer. W-plugs may be used as the bottom electrode in one embodiment. Accordingly, the bottom electrode of the resistive switching device comprises a fill material 40, e.g., comprising tungsten, and a barrier layer 30. In other embodiments, the bottom electrode may comprise platinum, ruthenium, titanium nitride, tantalum nitride, titanium tungsten (TiW), molybdenum, gold, nickel, cobalt, iridium, and combinations thereof, and such others. The fill material 40 may deposited using a CVD, PVD, or other suitable deposition processes in various embodiments.

Next, a polishing process may be used to remove the overfilled fill material 40 and optionally any remaining conductive barrier 40 from over the second dielectric layer 50. In one embodiment, a chemical-mechanical polishing (CMP) process is used for the planarization process. The CMP process may be stopped after removing the fill material 40 and the barrier layer 30 in one embodiment, for example, by using a polish stop layer described above. In alternative embodiments, an etch process or a combination of etch and CMP processes may be used instead of the CMP process.

Figure 2C:
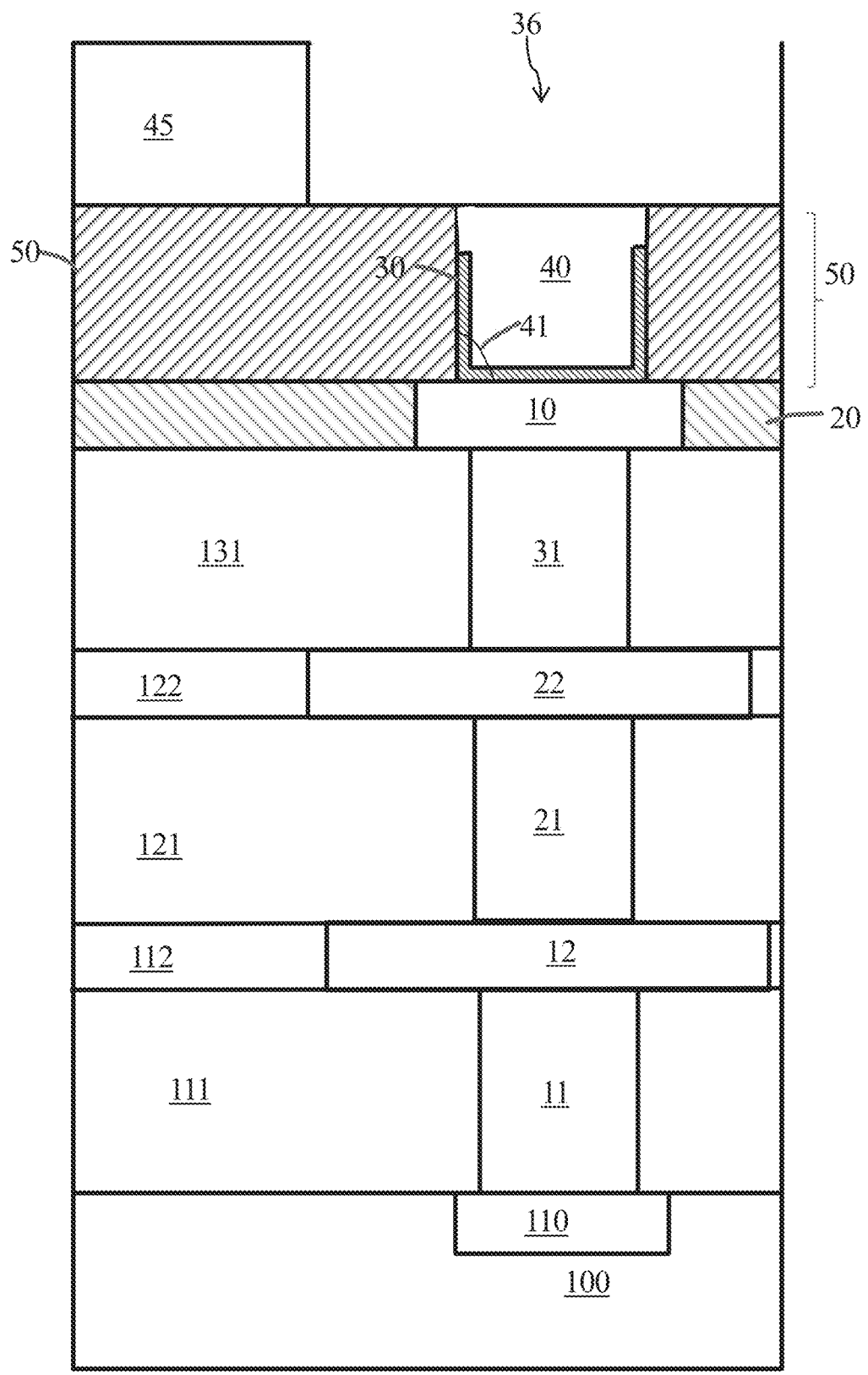

Referring to FIG. 2C, a third dielectric layer 45 is deposited over the second dielectric layer 50. The third dielectric layer 45 may comprise a same material as the second dielectric layer 50 in one embodiment. In an alternative embodiment, the third dielectric layer 45 may comprise a silicon nitride layer. In various embodiments, the third dielectric layer 45 may include silicon di oxide including TEOS oxide, silicon nitride, silicon oxynitride, and other low-k dielectrics. The third dielectric layer 45 may be a bilayer in some embodiments.

A photo resist layer is deposited over the third dielectric layer 45. The photo resist layer is exposed to form openings for switching layer 36 using a lithographic process. The openings for switching layer 36 expose a top surface of the fill material 40.

Figure 2D:
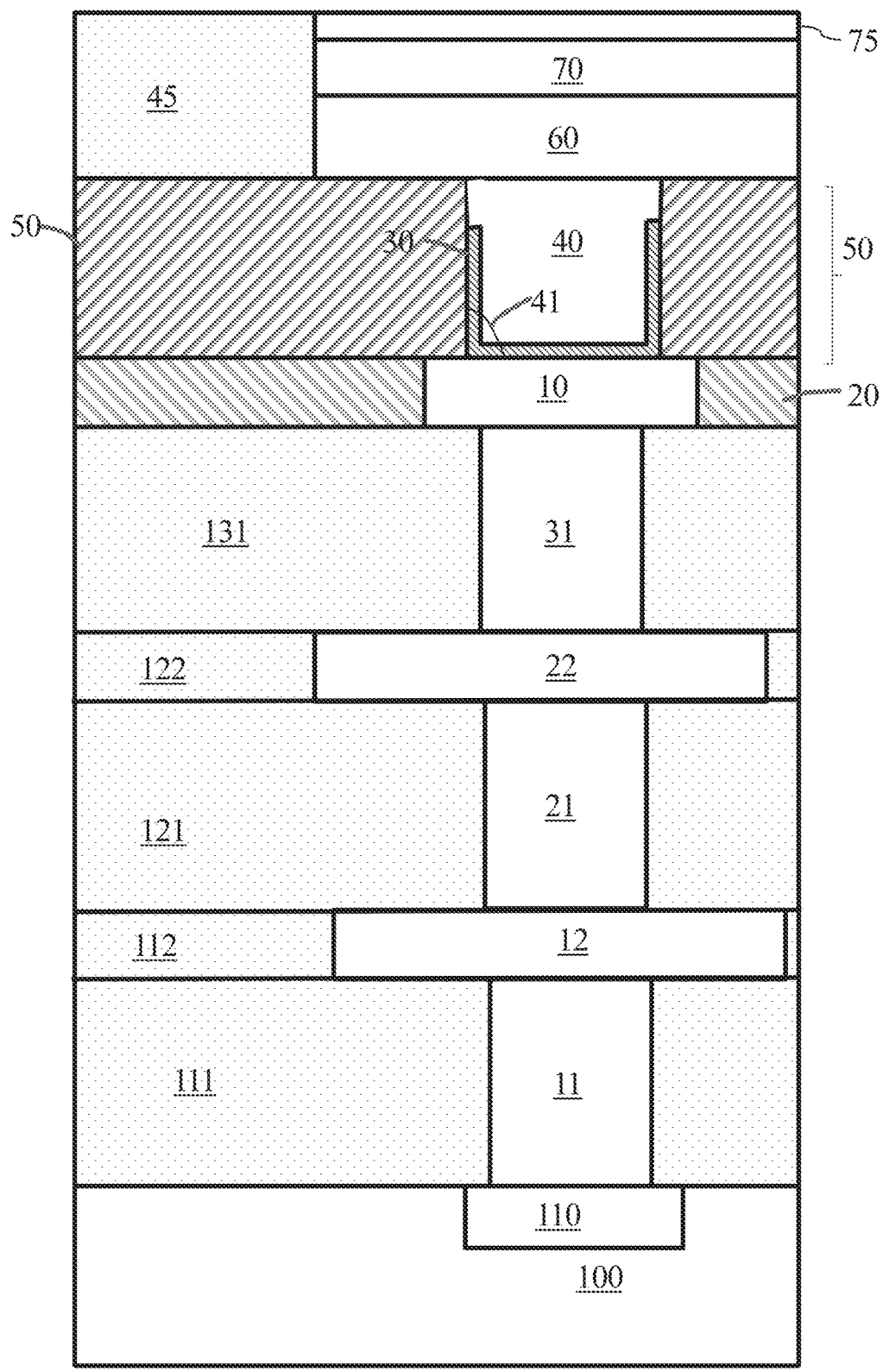

As next illustrated in FIG. 2D, a switching layer 60 is deposited within the openings for switching layer 36. The switching layer 60 is deposited over the exposed top surface of the second dielectric layer 50 and the fill material 40.

In one or more embodiments, the switching layer 60 may comprise a solid electrolyte layer that provides an ion conducting path capable of forming a conductive bridge. In various embodiments, the switching layer 60 may comprise a chalcogenide material such as a germanium based chalcogenide, e.g., a copper doped $GeS_2$ layer. In an alternative embodiment, the switching layer 60 may comprise silver doped $GeS_2$. In various embodiments, the switching layer 60 may comprise $Ge_xS_y$, $Ge_xSe_y$, $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, $GeTe$, $GST$, $As-S$, $Zn_xCd_{1-x}S$, $TiO_2$, $ZrO_2$, methylsilesquioxane, $GdOx$, and/or $SiO_2$. In some embodiments, the switching layer 60 may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof. For example, the switching layer 60 may comprise doped metal oxides such as copper and/or silver doped hafnium oxide, gadolinium oxide, and other such materials.

In one embodiment, the switching layer 60 may comprise transition metal oxides that change conductivity due to the formation of charged point defects such as oxygen vacancies and other charge complexes so as to form a metallic conducting phase. In such embodiments, the switching layer 60 may comprise metal oxides such as copper and/or silver doped hafnium oxide, gadolinium oxide, and other such materials in various embodiments. In other examples, a metal oxide based switching layer 60 may comprise $NiO_x$, $TiO_x$, $Al_2O_3$, $Ta_2O_5$, $CuO_x$, $WO_x$, $CoO$, chromium doped perovskite oxides such as $SrZrO_3$, $(Ba, Sr)TiO_3$, $SrTiO_3$, copper doped $MoO_x$, copper doped $Al_2O_3$, copper doped $ZrO_2$, Al doped $ZnO$, $Pr_{0.7}Ca_{0.3}MnO_3$.

The switching layer 60 may be deposited using a PVD, CVD, PECVD, ALD, and other suitable deposition process. The switching layer 60 may be doped during or after the deposition process. In one or more embodiments, the switching layer 60 may be doped using a photo-doping process. In various embodiments, the switching layer 60 may comprise a thin film of $GeS_2$ deposited by radio frequency (RF) PVD process and a thin layer of electrochemically active metal deposited by DC PVD process. In one embodiment, this thin layer of electrochemically active metal may be subsequently dissolved into the $GeS_2$ film using a photo-diffusion process to form a doped $GeS_2$ layer. In other embodiments, the switching layer 60 may be formed, e.g., using a deposition process to form $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, $GeTe$, $GST$, $As-S$, $Zn_xCd_{1-x}S$, $TiO_2$, $ZrO_2$, $SiO_2$. In some embodiments, a plurality of layers may be deposited, for example, using an atomic layer deposition process to form a stack comprising $Ge_xSe_y/SiO_x$, $Ge_xSe_y/Ta_2O_5$, $Cu_xS/Cu_xO$, $Cu_xS/SiO_2$. In further embodiments, one or more layers of $NiO_x$, $TiO_x$, $Al_2O_3$, $Ta_2O_5$, $CuO_x$, $WO_x$, $CoO$, $Gd_2O_3$, $HfO_2$, chromium doped perovskite oxides such as $SrZrO_3$, $(Ba, Sr)TiO_3$, $SrTiO_3$, copper doped $MoO_x$, copper doped $Al_2O_3$, copper doped $ZrO_2$, Al doped $ZnO$, $Pr_{0.7}Ca_{0.3}MnO_3$ may be deposited as the switching layer 60.

A top electrode layer 70 is formed over the switching layer 60. The top electrode layer 70 may comprise an electrochemically active metal such as silver, copper, zinc, and others in various embodiments. The top electrode layer 70 may be deposited using a sputtering process, a vapor deposition process such as a physical vapor deposition process, chemical vapor deposition process, plasma enhanced chemical vapor deposition process, an atomic layer deposition process, and other processes.

An optional capping layer 75 may be formed over the top electrode layer 70. The capping layer 75 may comprise titanium nitride or tantalum nitride (as well as other suitable materials) in various embodiments. The capping layer 75 may be deposited in one or more embodiments using sputtering or other vapor deposition processes. In various embodiments, the switching layer 60, the top electrode layer 70, and the capping layer 75 may be deposited without breaking vacuum, for example, using a cluster tool, which may be a PVD tool in one embodiment.

Referring to FIG. 2D, the bottom electrode contacting the switching layer 60 comprises a top surface having the same material. Unlike FIG. 1, which has two types of materials forming the top surface of the bottom electrode, in FIG. 2, only the fill material 40 contacts the switching layer 60.

Figure 3A:
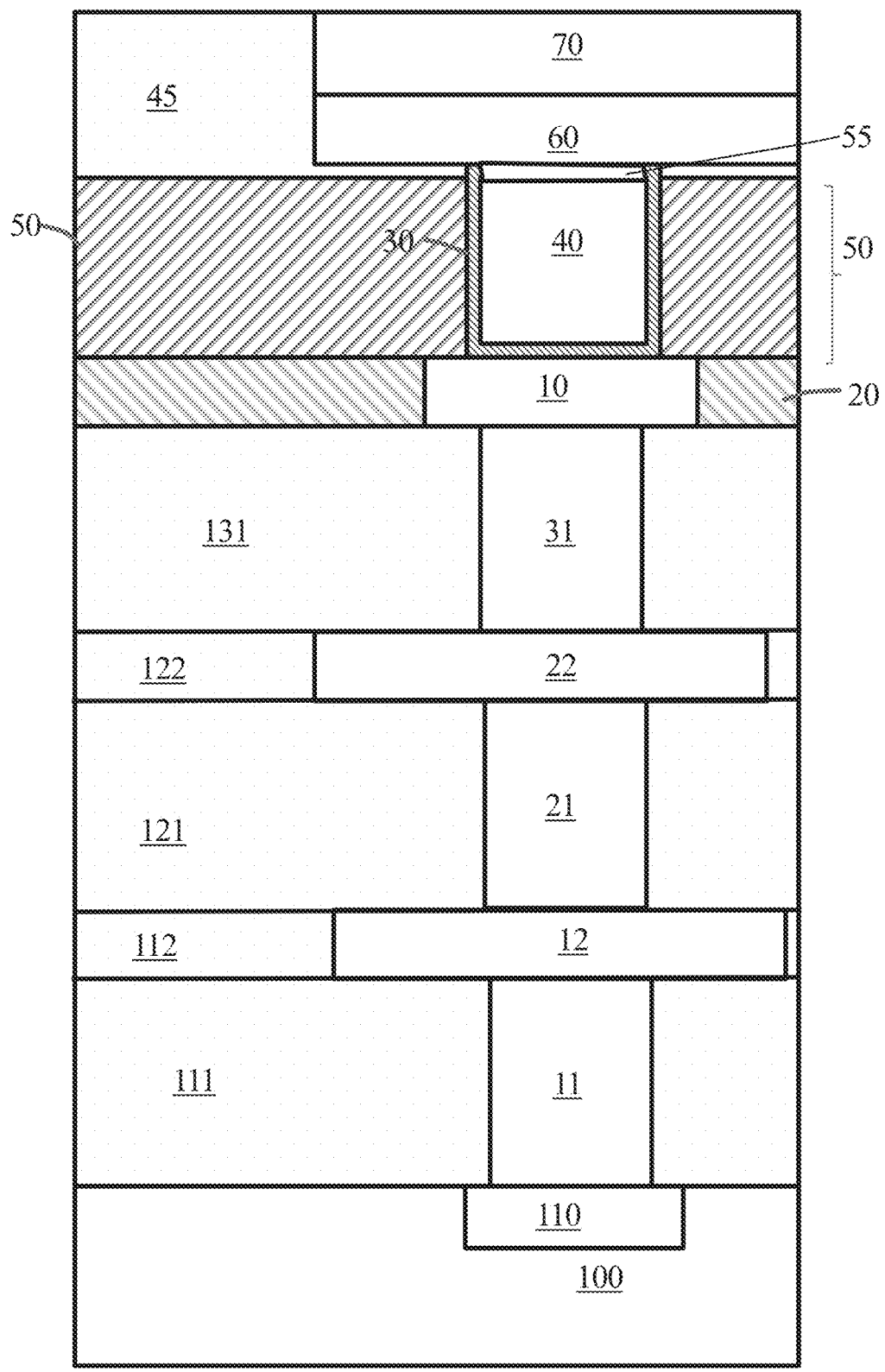
FIGS. 3A and 3B, illustrates embodiments in which one of the top surface of the bottom electrode of the resistive switching device is deactivated or may not participate in the electrical operation of the device.
Figure 3B:
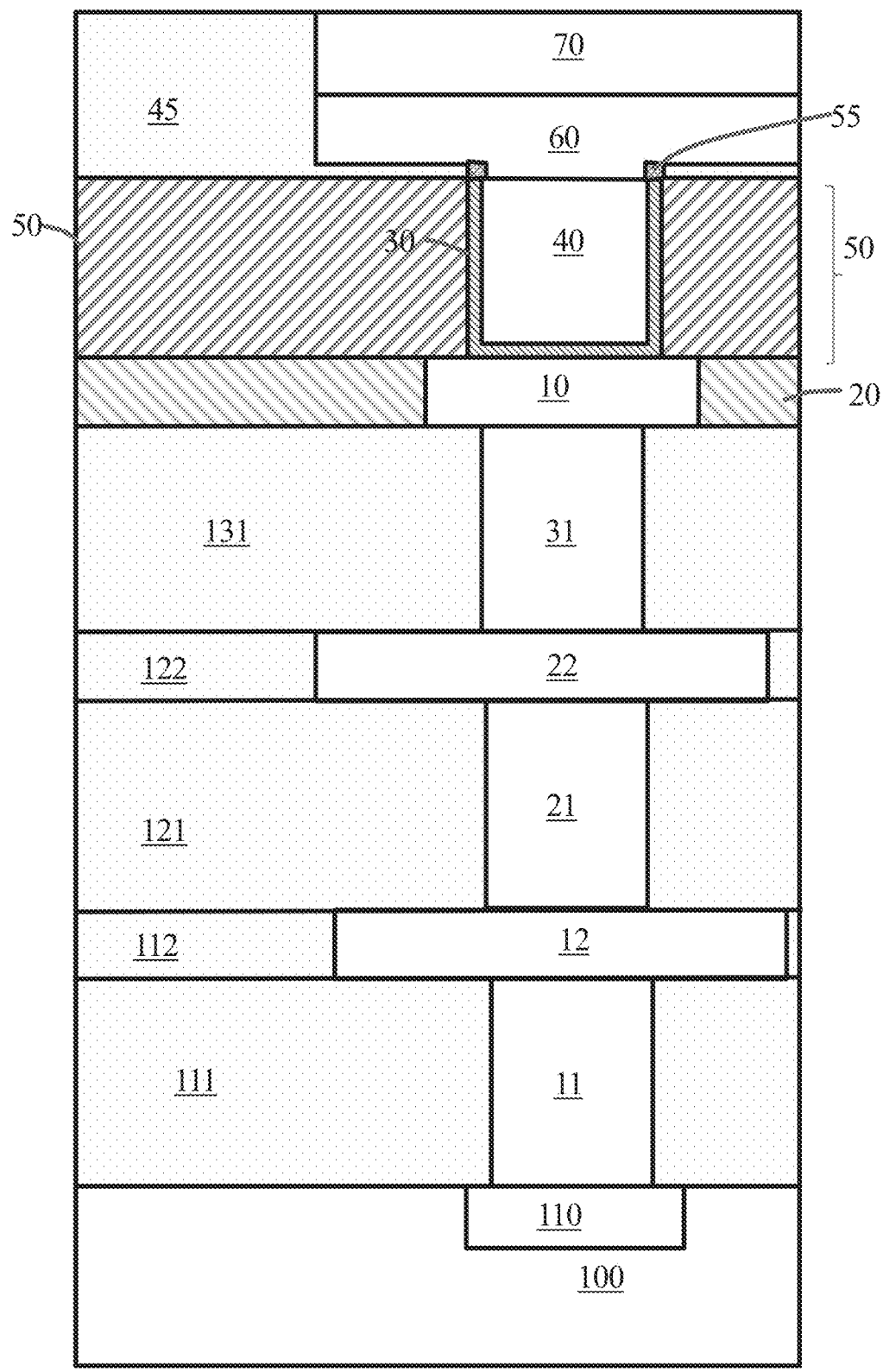

FIG. 3, which includes FIGS. 3A and 3B, illustrates embodiments in which one of the top surface of the bottom electrode of the resistive switching device is deactivated or does not participate in the electrical operation of the device.

In embodiment illustrated in FIG. 3A, the resistive switching device is formed between the barrier layer 30 and the switching layer 60. An additional cap layer 55, which may be a dielectric layer, may be formed over the fill material 40. Consequently, the fill material 40 is separated from the switching layer 60 by the cap layer 55. The cap layer 55 may comprise a dielectric layer to prevent electrical contact between the fill material 40 and the switching layer 60. The cap layer 55 may deactivate the fill material 40 from participating in the switching action by changing the potential drop through the switching layer 60 and/or by cutting the flow of current. For example, the potential drop across the switching layer 60 between the capping layer 55 and the top electrode 70 may be smaller than the voltage drop across the switching layer 60 between the barrier layer 30 and the top electrode 70.

Further, in various embodiments, the cap layer 55 may comprise low-k dielectric material (dielectric permittivity less than silicon oxide) to further minimize the capacitive effects. The cap layer 55 may also be selected to minimize leakage currents due to tunneling of carriers from the fill material 40 and the switching layer 60 in various embodiments. Consequently, in one or more embodiments, the cap layer 55 may comprise a dielectric layer having an effective electrical thickness greater than 5 nm, e.g., silicon dioxide layer having a thickness of at least 5 nm or a silicon nitride having a thickness of at least 25 nm.

FIG. 3B illustrates an alternative embodiment in which the resistive switching device is formed between the fill material 40 and the switching layer 60. In this case, an additional cap layer 55 may be formed over the barrier layer 30. As in the prior embodiment of FIG. 3A, the cap layer 55 may be a dielectric material having an effective electrical thickness greater than 5 nm, e.g., silicon dioxide layer having a thickness of at least 5 nm or a silicon nitride having a thickness of at least 25 nm. As illustrated in FIG. 3B, the switching layer 60 contacts the fill material 40 without contacting the barrier layer 30.

Figure 4:
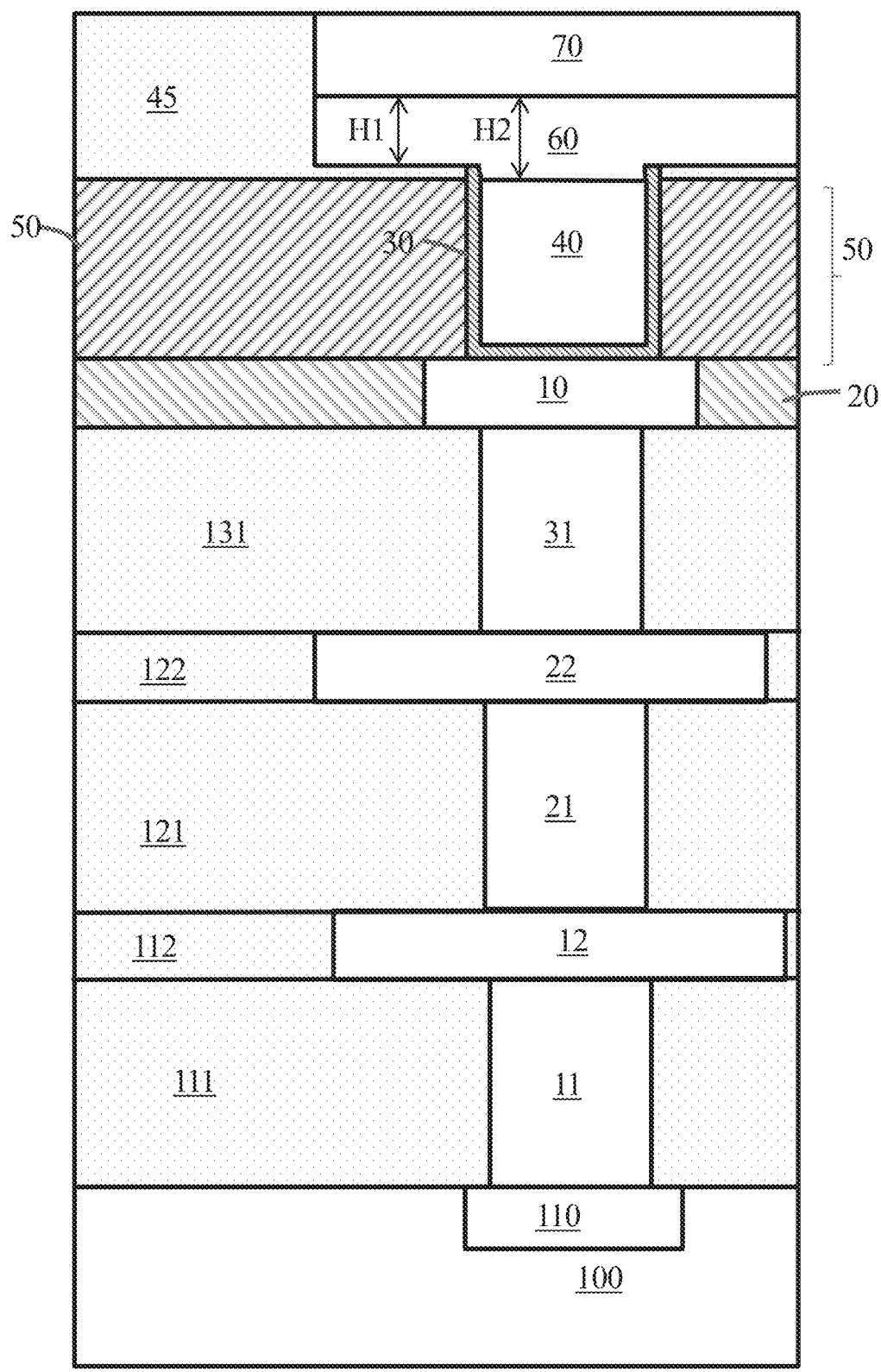
FIG. 4 illustrates an alternative embodiment of a resistive switching device comprising a barrier layer and a switching layer.

FIG. 4 illustrates an alternative embodiment of a resistive switching device comprising a barrier layer 30 and a switching layer 60. Unlike the prior embodiment, there is no additional layer between the switching layer 60 and the fill material 40. However, the first distance H1 is smaller than the second distance H2, which may be suitably adjusted. Therefore, the potential across the first distance H1 between the barrier layer 30 and the top electrode is larger than the potential drop across the second distance H2 between the fill material 40 and the top electrode 70. Accordingly, the conductive pathway of the low resistance state of the resistive switching device forms primarily over the barrier layer 30. Accordingly, in this embodiment, the surface properties of the fill material 40 are made to be less important relative to the surface properties of the barrier layer 30.

Figure 5:
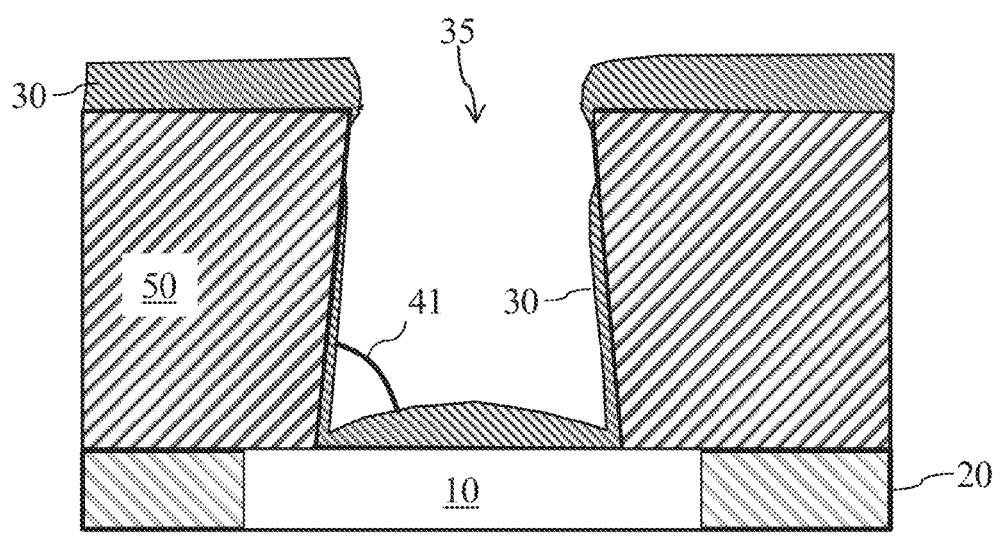
FIG. 5 illustrates a resistive switching device in accordance with an alternative embodiment of the present invention.

FIG. 5 illustrates a resistive switching device in accordance with an alternative embodiment of the present invention. FIG. 5 refers to one embodiment of forming a structure similar to that of FIG. 2. The opening 35 for the bottom electrode may be tailored or angled in one or more embodiments so that the material of the barrier layer 30 may not deposit over the rim portion of the opening 35 during subsequent deposition.

In one embodiment, the sidewall angle 41 may be less than 90°, for example about 70° to about 90°, and about 80° to about 85° in one embodiment. Alternatively, the deposition of the barrier layer 30 may be controlled to achieve a similar effect. For instance, the deposition direction may be angled in a directional deposition technique such as sputter deposition. For example, the wafer (carrier holding the wafer) may be angled and rotated during deposition. In one embodiment, the wafer may be tilted by about 5° to about 25°, and about 1° to about 5° in another embodiment. The chuck carrying the wafer may be rotated continuously or in steps (e.g., 45°, 90°, 135° etc.). Embodiments of the invention also include combinations of the above. In various embodiments, the profile and coverage of the barrier layer 30 may also be controlled by various deposition process adjustments including variations in bias power, source power, pressure, gas flow rate and/or temperature.

Advantageously, using such tilted sidewall and/or tilted deposition, a thick barrier layer 30 is formed on the bottom surface of the opening 35 as illustrated in FIG. 5. After depositing the barrier layer 30, the fill material 40 is deposited and a chemical mechanical planarizing (CMP) may be performed to planarize the structure thereby forming a structure similar to FIG. 2B. Subsequent processing may follow as described with respect to FIG. 2.

Embodiments of the invention also include deactivating the barrier layer 30 so that the top surface of the barrier layer 30 may not take part in the operations of the resistive switching device. An embodiment of such a method will be described using FIG. 6, which includes FIGS. 6A-6D.

Figure 6A:
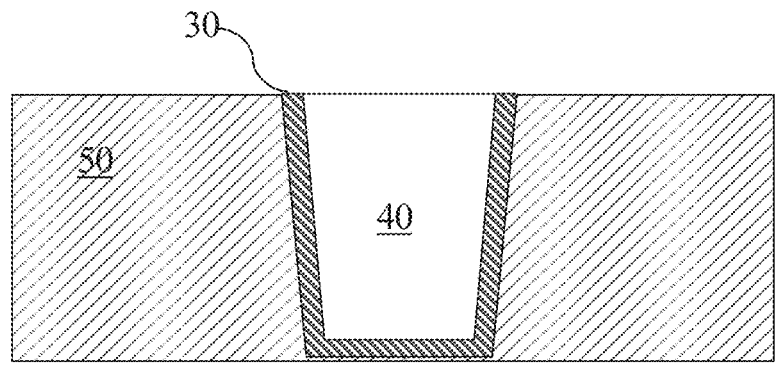
Figure 6B:
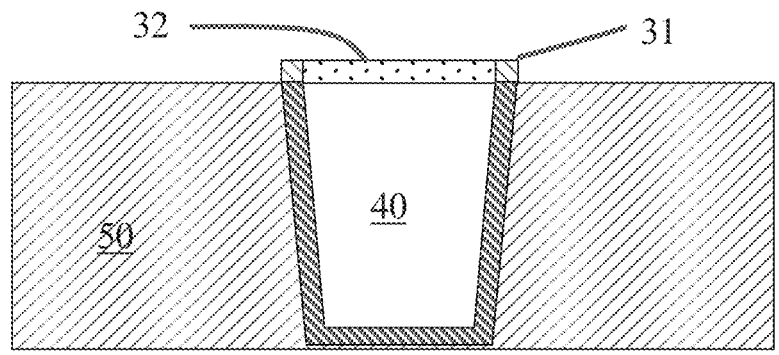
Figure 6C:
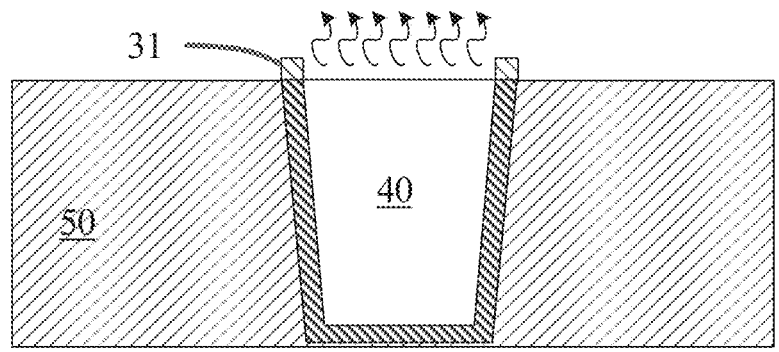
Figure 6D:
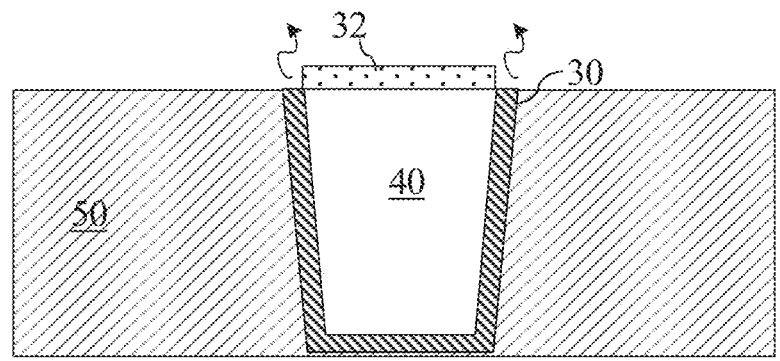

FIG. 6, which includes FIGS. 6A-6D, illustrates a resistive switching device during various states of fabrication, wherein the top surfaces are selectively modified. FIGS. 6C and 6D illustrate alternative embodiments. This method may be used to form the structure illustrated in FIG. 3A or 3B in one embodiment.

Referring to FIG. 6A, the barrier layer 30 and the fill material 40 may be formed within the opening 35 as described previously. Next, the exposed top surfaces of the barrier layer 30 and the fill material 40 are subjected to a treatment. In various embodiments, the treatment is configured to selectively react with one or both barrier layer 30 and the fill material 40. In various embodiments, the treatment may be a chemical, physical surface treatment and may also include exposing the surfaces to a plasma in some embodiments. As an illustration, in one embodiment, the treatment may be an oxidation process that oxidizes both the barrier layer 30 and the fill material 40 (FIG. 6B). The barrier layer 30 may oxidize and form a dielectric material layer 31 (similar to the cap layer 55 in FIG. 3B) while the fill material 40 may form a different fill material oxide 32.

As illustrated in FIG. 6C, the oxide of the fill material 40 may be subsequently removed, e.g., using a selective etch process without removing the oxide of the barrier layer 30. For example, when the barrier layer 30 comprises TiN, a titanium di oxide dielectric layer is formed over the barrier layer 30 and when the fill material 40 comprises tungsten, a tungsten oxide is formed over the fill material 40. The tungsten oxide may be dissolved/etched using water, dilute hydrofluoric acid and such others without etching the titanium oxide.

In an alternative embodiment of the invention as illustrated in FIG. 6D, the oxide of the barrier layer 30 may be selectively removed without removing the oxide of the fill material 40. Alternatively in some embodiments, selective reaction with the barrier layer 30 or the fill material 40 may create the final structure without the need for the etch process.

FIG. 7, which includes FIGS. 7A-7D, illustrates an alternative embodiment of the invention for forming the structure illustrated in FIG. 2.

Figure 7A:
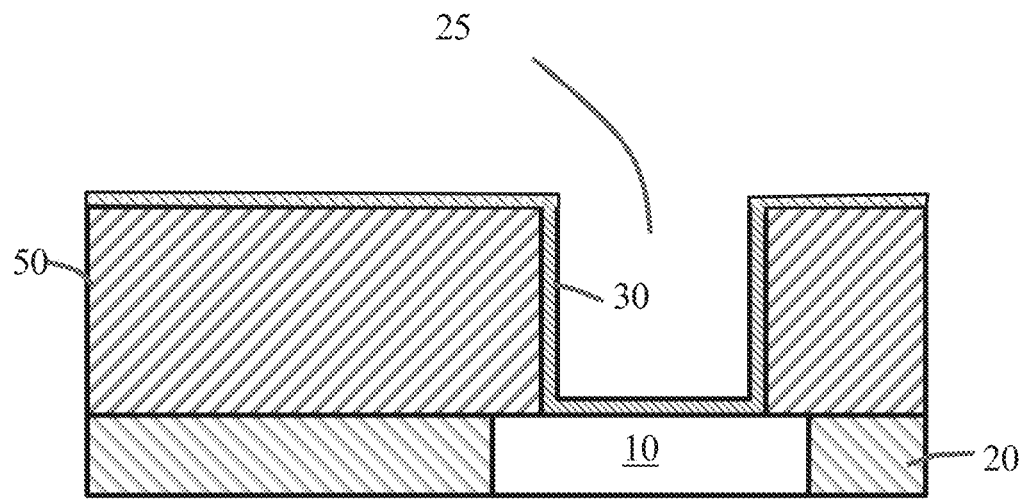
FIGS. 7A-7D, illustrates an alternative embodiment of the invention for forming the structure illustrated in FIG. 2.
Figure 7B:
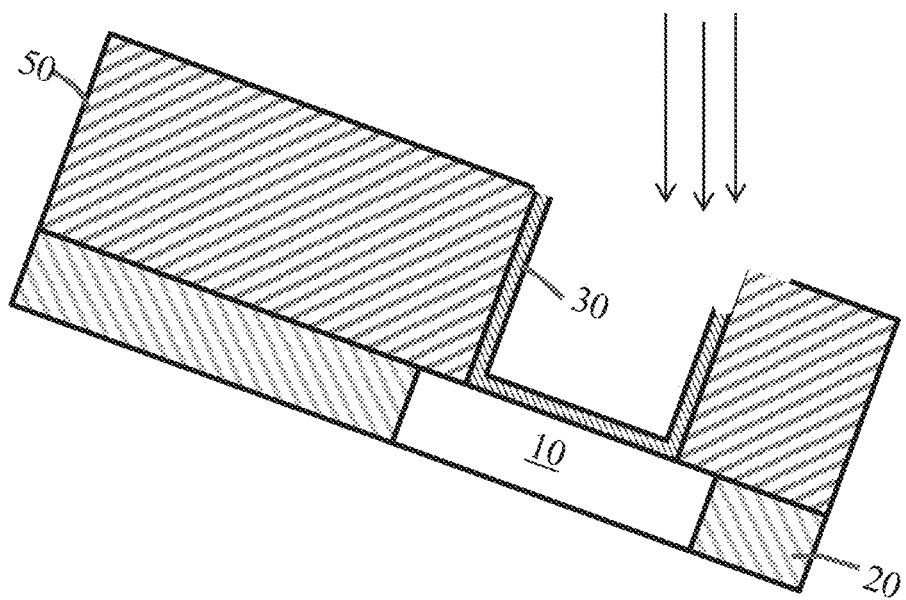
Figure 7C:
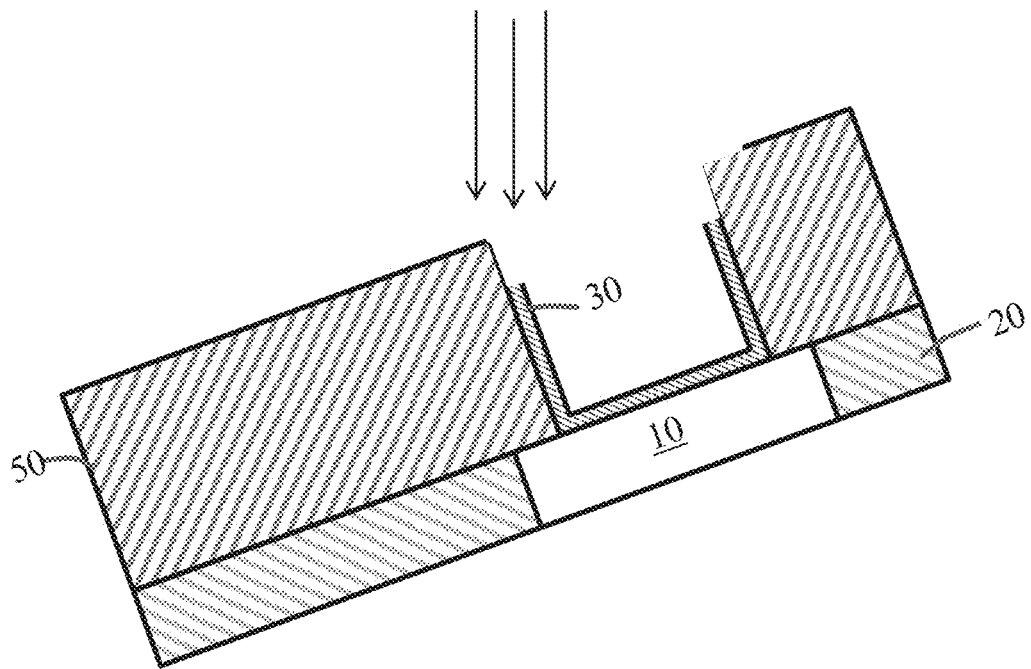

Referring to FIG. 7A, the barrier layer 30 is first formed within an opening 35. Next, as illustrated in FIGS. 7B and 7C, an angled etch is used to remove the outer rim of the barrier layer 30. The angling may be obtained by either tilting the substrate (e.g., the wafer) or the etch species is angled relative to the substrate. In various embodiments, the wafer or etch species angle may be rotated (as in FIGS. 7B and 7C) to remove the barrier layer 30 uniformly from the upper sidewall of the opening 35.

Figure 7D:
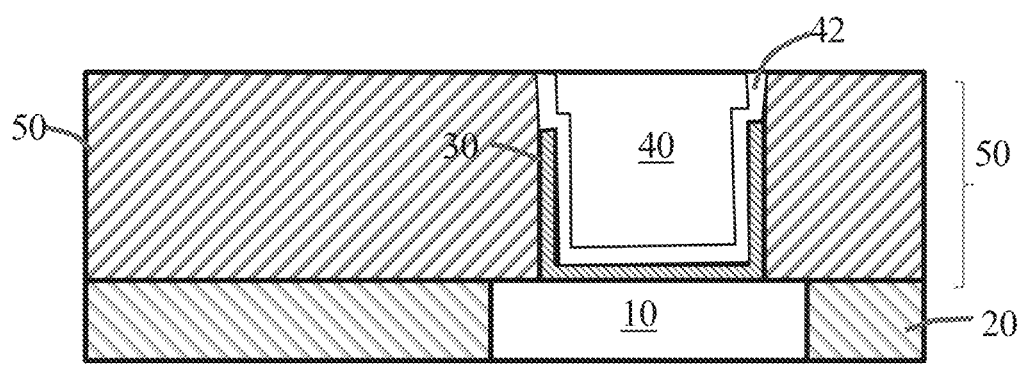

Subsequent processing may form a structure as shown in FIG. 2A. Alternatively, after removing the barrier layer 30 from the rim of the opening 35, an additional insulator may be deposited in some embodiments, or a different metal may be deposited. For example, in one embodiment, a thin layer of fill material 42 (e.g., tungsten layer) may be deposited using a plasma vapor deposition process (FIG. 7D). The thin layer of fill material 42 may be about 10 nm to about 50 nm in one embodiment and may be formed as a conformal layer. The PVD process provides excellent adhesion and avoids crack/delamination between the bottom electrode and the second dielectric material layer 50. Next, the fill material 40 may be deposited using a chemical vapor deposition process. However, in this embodiment, both the thin layer of fill material 42 and the fill material 40 are the same material and therefore there are no issues arising from differences in work function or other electronic properties.

An alternative embodiment of a method of formation of the resistive switching device will be described using FIG. 8. FIG. 8, which includes FIGS. 8A-8H, illustrates a resistive switching device during fabrication in accordance with various embodiments of the invention. The final structure of the inert electrode may be similar to the embodiment described in FIG. 2.

Figure 8A:
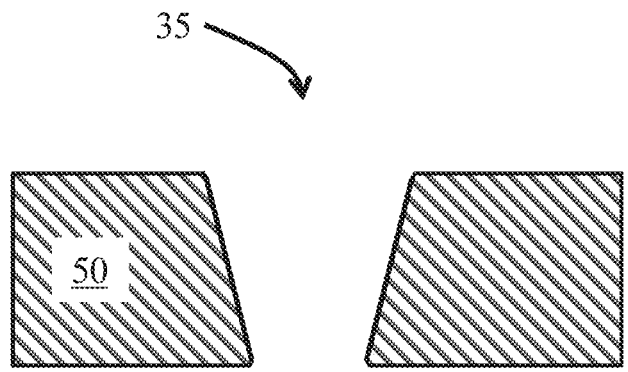
FIGS. 8A-8H, illustrates a resistive switching device during fabrication in accordance with various embodiments of the invention.

Referring to FIG. 8A, an opening 35 is formed within the second dielectric layer 50. The opening 35 may be formed over a metal line 10 as described previously. Additional layers underneath the second dielectric layer 50 are not shown for clarity.

Figure 8B:
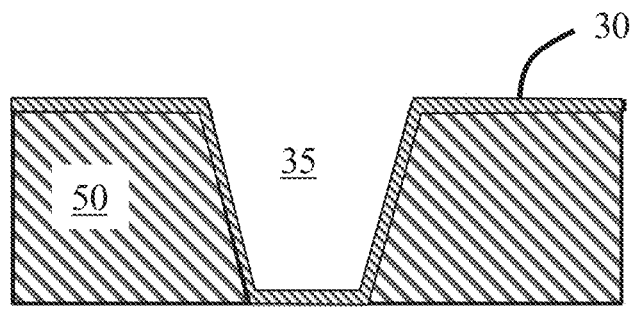
Figure 8C:
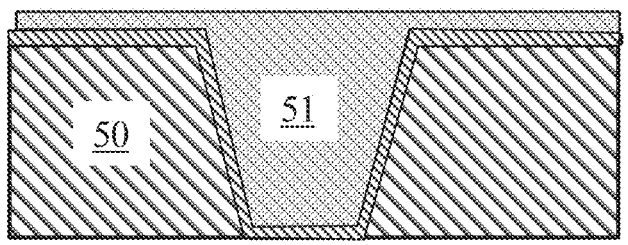

FIG. 8B illustrates the resistive switching device after the deposition of a liner. The liner may comprise the barrier layer 30 in various embodiments. Next, as illustrated in FIG. 8C, a dummy material 51 is deposited within the opening 35. The dummy material 51 may be a photo resist material or an anti-reflective coating such as a bottom anti-reflective coating (BARC) layer in an alternative embodiment. In other embodiments, the dummy material 51 may comprise any suitable material that is easily removed from within the opening 35 without significantly removing the second dielectric layer 50 or the barrier layer 30. The dummy material 51 may be applied using a coating process in one or more embodiments.

Figure 8D:
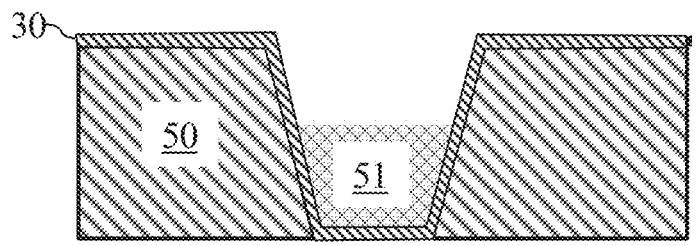

After forming the dummy material 51, a portion of the dummy material 51 is removed as illustrated in FIG. 8D. In one case, the dummy material 51 is subjected to an etching process, which may be timed to achieve a certain fill height as in FIG. 8D. Alternatively, the dummy material 51 may be partially filled during the forming of the dummy material 51 (instead of overfilling followed by an etch back) so as to directly form the structure illustrated in FIG. 8D. The partial fill by the dummy material 51 exposes an upper portion of the liner material.

Figure 8E:
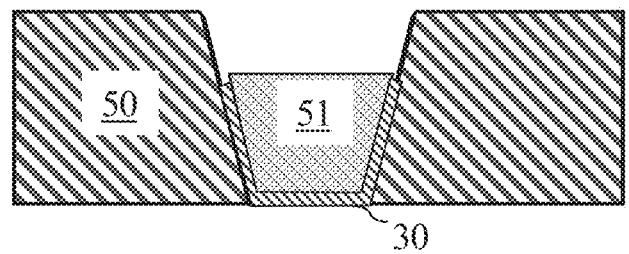

The exposed liner is next removed thereby forming the structure illustrated in FIG. 8E. In one embodiment, a single etching process may remove both the dummy material 51 and the liner thereby skipping the structure illustrated in FIG. 8D. In some embodiments, the etching of the dummy material 51 and the exposed liner may be performed within a single multi-chamber cluster tool, e.g., without breaking vacuum.

Figure 8F:
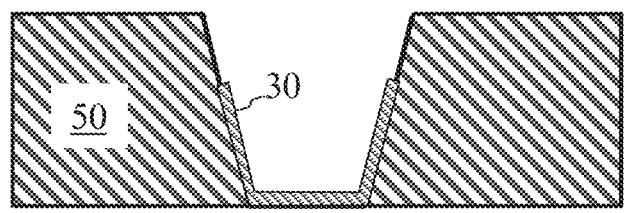
Figure 8G:
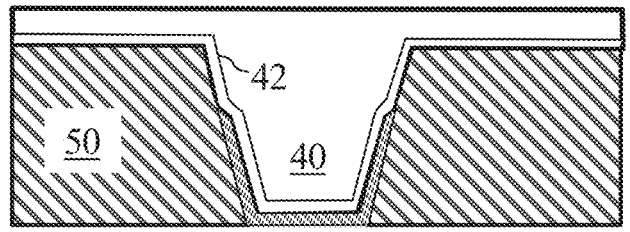
Figure 8H:
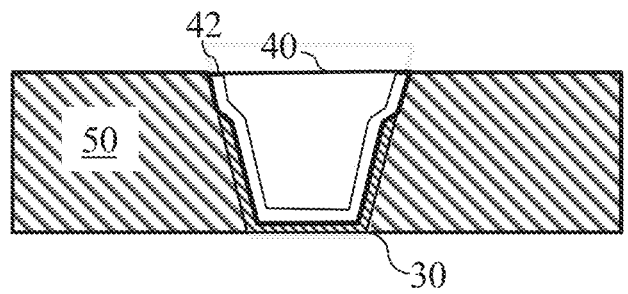

Referring next to FIG. 8F, the dummy material 51 is removed, for example, a resist strip process may be used. For example, a wet etching process may be used in one or more embodiments. After removing the dummy material 51, the fill material 40 is deposited within the opening 35. The fill material 40 is overfilled as illustrated in FIG. 8G. The overfill may be removed using a planarization process to form the structure illustrated in FIG. 8H. Advantageously, in various embodiments, any cracks formed between the upper sidewalls of the opening 35 and the fill material 40 may also be removed during the planarization (due to thinning).

As described in the embodiment of FIG. 7, in this embodiment, the fill material 40 may be deposited in at least two steps. As illustrated in FIG. 8G, first, using a first deposition process, e.g., a PVD process, a thin layer of fill material 42 is formed, for example, using a conformal deposition process. Then, using a second deposition process, e.g., a CVD process, the fill material 40 is deposited. The multiple step deposition process may be used to ensure good adhesion between the fill material 40 and the sidewalls of the opening 35.

Figure 9A:
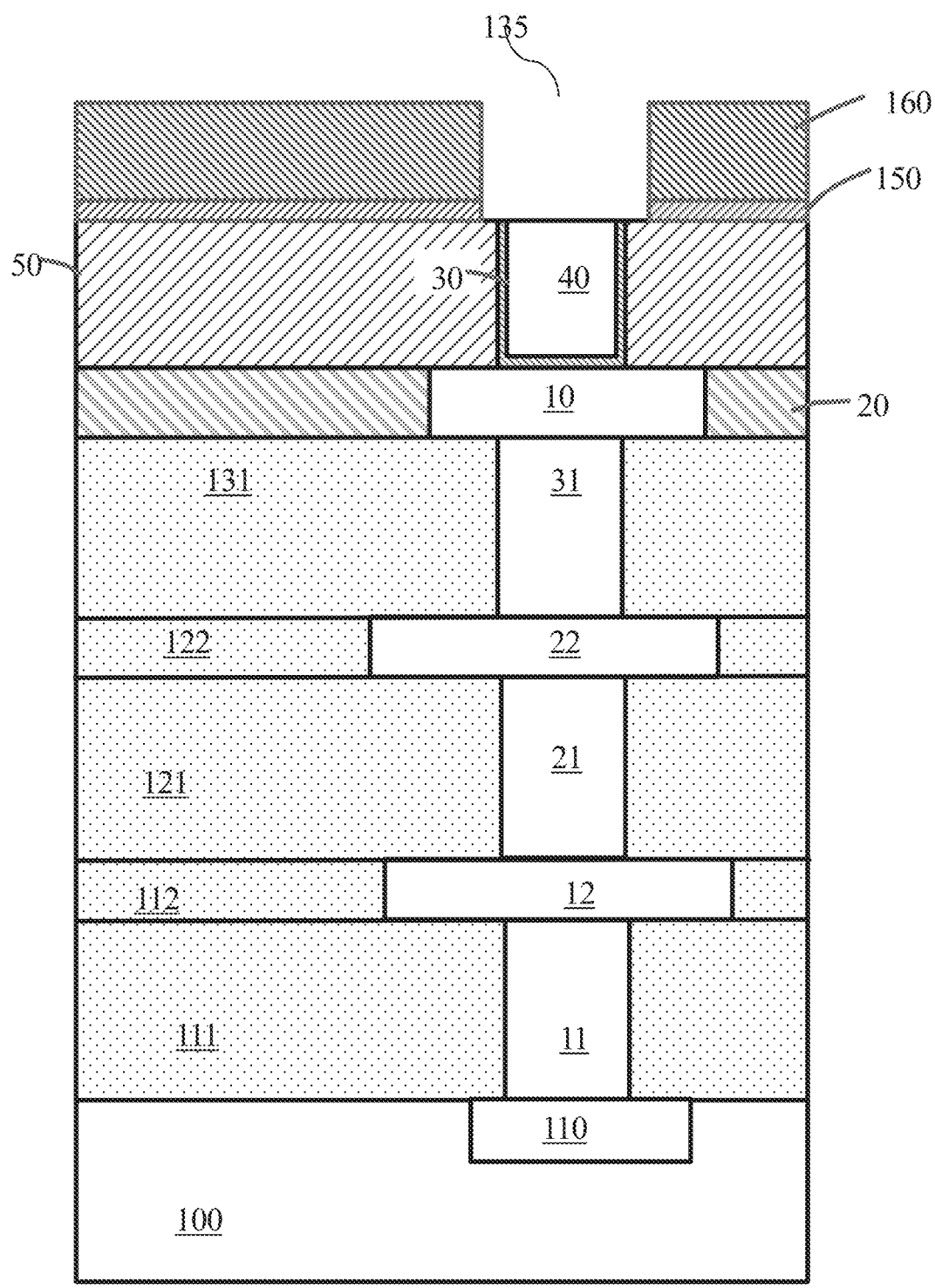
FIG. 9, which includes FIGS. 9A and 9B, describes an alternative resistive switching device during various stages of fabrication in accordance with an embodiment of the invention.
Figure 9B:
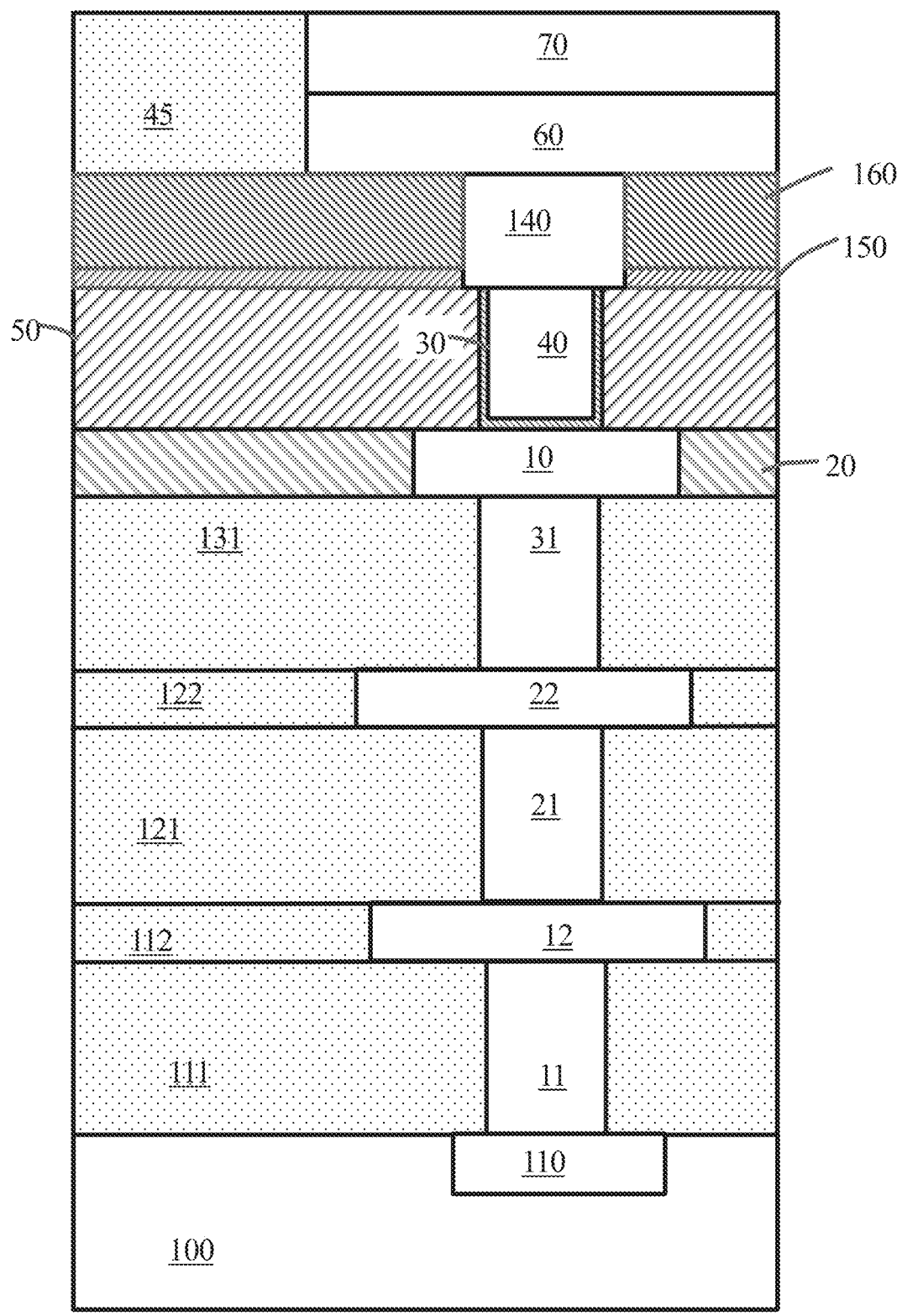

FIG. 9, which includes FIGS. 9A and 9B, describes an alternative resistive switching device during various stages of fabrication in accordance with an embodiment of the invention.

In this embodiment, the bottom electrode comprises a first portion and a second portion. Referring to FIG. 9, the second portion of the bottom electrode may be formed using conventional processing. Consequently, a barrier layer 30 and a fill material 40 are formed to form a second portion of the bottom electrode. However, as will be described, over this second portion, the first portion is formed. As will be described, the first portion contacts the switching layer 60 of the resistive switching device. As illustrated in FIG. 9A, a liner 150, e.g., an etch stop liner, is deposited over the second dielectric layer 50, the barrier layer 30, and the fill material 40.

Next, a fourth dielectric layer 160 is deposited over the liner 150. An electrode opening 135 is formed within the fourth dielectric layer 160. The electrode opening 135 may also extend through the liner 150 thereby exposing the top surfaces of the barrier layer 30 and the fill material 40.

As next illustrated in FIG. 9B, the electrode opening 135 within the fourth dielectric layer 160 is filled with a second fill material 140, e.g., tungsten. Thus, the bottom surface of the second fill material 140 contacts the top surface of the fill material 40. In various embodiments, the second fill material 140 and the fill material 40 do not interact. Alternatively, even if the fill material 40 interacts with the second fill material 140, the top surface of the second fill material 140 does not include a chemically active species, for example, any non-inert atoms from the fill material 40 or the barrier layer 30. Advantageously, in one or more embodiments, because the same material is deposited (e.g., tungsten over a prior tungsten layer), no additional barrier layer is required between the first fill material 40 and the second fill material 140.

The various embodiments described above may be applied to any resistive memory such as a resistive metal oxide memory, phase change memory, resistive random access memory, conductive bridging random access memory, and others. For example, in one or more embodiments, various resistive memories such as phase change memories, nano-conductive bridge memories may be formed above (and contacting) the inert electrode formed from the fill material 40 as described in various embodiments of FIGS. 2-9.

Further, in various embodiments, other types of memories including other types of resistive memories, ferroelectric memory, and others may be formed above (and contacting) the inert electrode formed from the fill material 40 as described in various embodiments of FIGS. 2-9. Similarly, in various embodiments, other types of devices such as a one time programmable devices, a field-programmable gate array devices may be formed above (and contacting) the inert electrode comprising the fill material 40 as described in various embodiments of FIGS. 2-9.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-9 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A resistive switching device comprising:
an opening disposed within a first dielectric layer;
a conductive barrier layer disposed on sidewalls of the opening;
a fill material comprising an inert material filling the opening and the fill material extends above the conductive barrier layer so that a top surface of the fill material is above the conductive barrier, wherein the conductive barrier comprises a metal nitride;
a solid electrolyte layer disposed over the opening, the solid electrolyte layer contacting the fill material but not the conductive barrier layer, wherein the solid electrolyte layer overlaps with an entire top surface of the fill material and the conductive barrier layer; and
a top electrode disposed over the solid electrolyte.

2. The device of claim 1, wherein the resistive switching device comprises a resistive metal oxide memory, a phase change memory, or a conductive bridging random access memory.

3. The device of claim 1, wherein the resistive switching device is a one time programmable device or a field-programmable gate array.

4. The device of claim 1, further comprising an inert liner disposed between the fill material and the conductive barrier layer, the inert liner comprising the same material as the fill material.

5. The device of claim 1, wherein the metal nitride comprises TiN, TaN, or WN.

6. The device of claim 1, wherein the conductive barrier layer comprises TiN, wherein the fill material comprises tungsten.

7. The device of claim 6, wherein the top electrode comprises copper.

8. The device of claim 1, wherein the fill material comprises a material selected from the group consisting of tungsten, titanium nitride, tantalum nitride, tungsten nitride, ruthenium, platinum, titanium tungsten (TiW), molybdenum, gold, nickel, cobalt, and iridium.

9. The device of claim 1, wherein the top electrode comprises silver, copper, and/or zinc.

10. The device of claim 1, wherein the solid electrolyte layer comprises a material selected from the group consisting of $Ge_xS_y$, $Ge_xSe_y$, Ge—Te, GST, As—S, $SiO_2$, $TiO_2$, $ZrO_2$, $GdO_x$, $Ge_xSe_y/SiO_x$, $Ge_xSe_y/Ta_2O_5$, $Cu_xS/Cu_xO$, $Cu_xS/SiO_2$, $WO_3$, $Cu_2S$, $Ta_2O_5$, $Zn_xCd_{1-x}S$, $Zn_xCd_{1-x}S$, $Zn_xCd_{1-x}S$, aluminum oxide, and hafnium oxide.

11. The device of claim 1, wherein the rim extends vertically underneath the solid electrolyte and along the sidewalls of the opening for about 5 nm to about 20 nm.

12. The device of claim 1, wherein the conductive barrier layer comprises an inert material different from the fill material.

13. The device of claim 1, wherein the conductive barrier layer comprises a nitride of at least one of tungsten, titanium, tantalum, ruthenium, titanium tungsten (TiW), and molybdenum.

14. A resistive switching device comprising:
an opening disposed within a first dielectric layer;
a conductive barrier layer disposed on sidewalls of the opening, wherein the conductive barrier comprises a metal nitride;
a fill material comprising an inert material filling the opening, wherein the fill material extends above the conductive barrier layer so that a top surface of the fill material is above the conductive barrier layer;
a solid electrolyte layer disposed over the opening, the solid electrolyte layer contacting the fill material but not the conductive barrier layer; and
a top electrode disposed over the solid electrolyte.

15. A resistive switching device comprising:
an opening disposed within a first dielectric layer;
a conductive barrier layer disposed on sidewalls of the opening, wherein the conductive barrier comprises a metal nitride;
a fill material comprising an inert material filling the opening, wherein the fill material extends above the conductive barrier layer so that a top surface of the fill material is above the conductive barrier layer;
a solid electrolyte layer disposed over the opening, the solid electrolyte layer contacting the fill material but not the conductive barrier layer, wherein the solid electrolyte layer forms a switching layer of a resistive metal oxide memory, or a conductive bridging random access memory; and
a top electrode disposed over the solid electrolyte.

* * * * *